United States Patent
Mauder et al.

(10) Patent No.: US 9,400,513 B2
(45) Date of Patent: Jul. 26, 2016

(54) CASCODE CIRCUIT

(71) Applicant: Infineon Technologies Austria AG, Villach (AT)

(72) Inventors: Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/318,820

(22) Filed: Jun. 30, 2014

(65) Prior Publication Data

US 2015/0378375 A1 Dec. 31, 2015

(51) Int. Cl.
*H01L 29/808* (2006.01)
*G05F 1/46* (2006.01)
*H01L 29/78* (2006.01)
*H01L 29/739* (2006.01)
*H01L 27/06* (2006.01)
*H01L 29/872* (2006.01)
*H01L 29/40* (2006.01)
*H01L 29/861* (2006.01)

(52) U.S. Cl.
CPC .............. *G05F 1/46* (2013.01); *H01L 27/0629* (2013.01); *H01L 29/7395* (2013.01); *H01L 29/7802* (2013.01); *H01L 29/407* (2013.01); *H01L 29/8611* (2013.01); *H01L 29/872* (2013.01)

(58) Field of Classification Search
CPC .............. H01L 27/088; H01L 29/7835; H01L 29/7838; H03K 17/102; H02M 3/1588; H02M 3/33592; H02M 7/217; H02M 1/00; H02M 2001/0009; H02M 2001/0048; H02M 2001/0054; H02M 7/25

USPC .............. 257/E27.06, 29.246, 194, E27.069; 327/430, 434, 502; 363/127

See application file for complete search history.

(56) References Cited

U.S. PATENT DOCUMENTS

| | | | |
|---|---|---|---|
| 4,317,055 A | 2/1982 | Yoshida | |
| 4,367,421 A | 1/1983 | Baker | |
| 4,468,686 A | 8/1984 | Rosenthal | |
| 4,487,458 A | 12/1984 | Janutka | |
| 4,751,408 A * | 6/1988 | Rambert | H03K 17/691 327/436 |
| 4,893,070 A | 1/1990 | Milberger et al. | |
| 5,237,193 A | 8/1993 | Williams et al. | |
| 5,285,369 A | 2/1994 | Balakrishnan | |
| 5,557,127 A | 9/1996 | Ajit et al. | |
| 5,696,659 A | 12/1997 | Maruo | |
| 6,304,094 B2 | 10/2001 | Gilliam | |

(Continued)

FOREIGN PATENT DOCUMENTS

DE 3100795 A1 8/1982
DE 3335475 A1 5/1985

(Continued)

*Primary Examiner* — David Vu
*Assistant Examiner* — Jonathan Han
(74) *Attorney, Agent, or Firm* — Murphy, Bilak & Homiller, PLLC

(57) ABSTRACT

An electronic circuit includes a first semiconductor device and a second semiconductor device. The first semiconductor device includes a load path and an internal voltage divider with a voltage divider tap. The second semiconductor device includes a load path and a control node. The first semiconductor device and the second semiconductor device have their load paths connected in series. The voltage divider tap of the first semiconductor device is coupled to the control node of the second semiconductor device.

19 Claims, 7 Drawing Sheets

(56) References Cited

U.S. PATENT DOCUMENTS

| | | |
|---|---|---|
| 6,365,930 B1 | 4/2002 | Schillaci et al. |
| 6,504,697 B1 | 1/2003 | Hille |
| 6,888,396 B2 | 5/2005 | Hajimiri et al. |
| 6,914,297 B2 | 7/2005 | Deboy et al. |
| 2001/0024138 A1* | 9/2001 | Dohnke ............... H01L 27/085 327/434 |
| 2003/0071320 A1 | 4/2003 | Kocon |
| 2004/0089896 A1 | 5/2004 | Sakakibara |
| 2006/0028901 A1 | 2/2006 | Bromberger et al. |
| 2006/0098365 A1 | 5/2006 | Harris et al. |
| 2010/0032671 A1 | 2/2010 | Marshall |
| 2010/0078694 A1 | 4/2010 | Willmeroth et al. |
| 2010/0078707 A1 | 4/2010 | Haeberlen et al. |
| 2010/0102871 A1 | 4/2010 | Werner |
| 2010/0301403 A1 | 12/2010 | Min et al. |
| 2012/0175634 A1 | 7/2012 | Weis |
| 2012/0175635 A1* | 7/2012 | Weis ................. H01L 27/0623 257/77 |
| 2012/0175679 A1* | 7/2012 | Marino ................. H01L 29/402 257/194 |
| 2013/0020635 A1 | 1/2013 | Yilmaz et al. |

FOREIGN PATENT DOCUMENTS

| | | |
|---|---|---|
| DE | 19745040 A1 | 8/1998 |
| DE | 10234493 B3 | 2/2004 |
| DE | 102004041198 A1 | 3/2006 |
| DE | 102007013848 A1 | 9/2008 |
| DE | 102009029694 A1 | 4/2010 |
| EP | 0140349 A2 | 5/1985 |
| EP | 1058318 A1 | 6/2000 |
| EP | 2521259 A2 | 11/2012 |
| GB | 2318685 A | 4/1998 |
| JP | 2007242719 A | 9/2007 |
| WO | 9501667 | 1/1995 |
| WO | 03079543 A1 | 9/2003 |
| WO | 2004107448 A1 | 12/2004 |
| WO | 2012093177 A2 | 7/2012 |

* cited by examiner

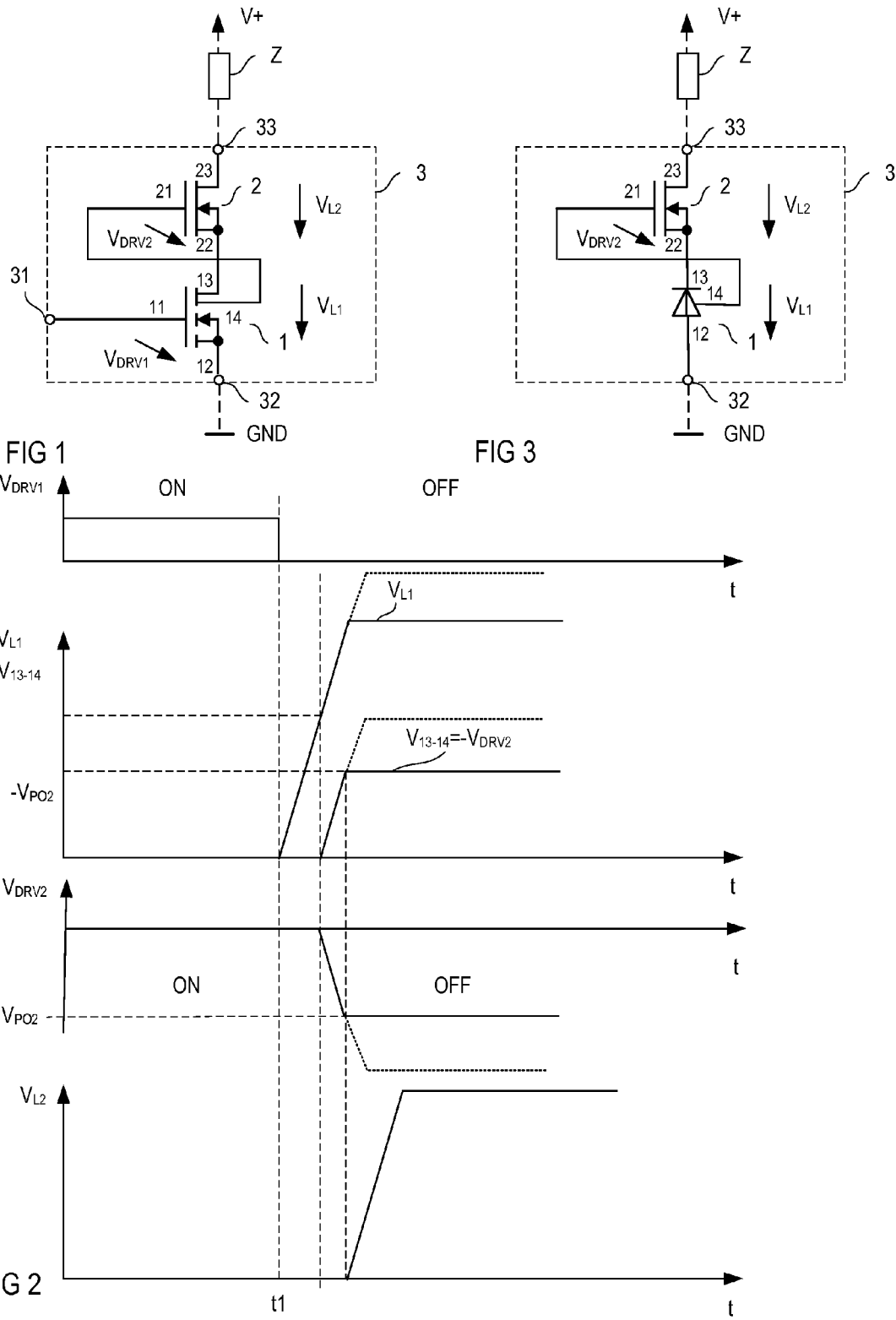

CASCODE CIRCUIT

TECHNICAL FIELD

This disclosure in general relates to a cascode circuit.

BACKGROUND

A conventional cascode circuit includes a first and a second transistor device which have their load paths connected in series. In a specific type of cascode circuit, the first transistor device receives as a drive voltage a load path voltage of the second transistor device, so that the second transistor device drives (controls) the first transistor. Thus, an operation state of the cascode circuit is governed by an operation state of the second transistor device. In this cascode circuit, the second transistor device should be designed such that a voltage level of the load path voltage does not increase above a maximum drive voltage level of the first transistor device. For example, a conventional normally-on FET (Field-Effect Transistor) used as the second transistor device may have a voltage blocking capability (a maximum load path voltage level) of several 100V, or even more, but cannot withstand drive voltages of more than several 10V. Thus, in a conventional cascode circuit the second transistor device can be implemented as a high-voltage device while the first transistor device is a low-voltage device.

However, it may be desirable to have a cascode circuit with two or more high voltage devices connected in series.

SUMMARY

One embodiment relates to an electronic circuit. The electronic circuit includes a first semiconductor device, and a second semiconductor device. The first semiconductor device includes a load path and an internal voltage divider with a voltage divider tap. The second semiconductor device includes a load path and a control node. The first semiconductor device and the second semiconductor device have their load paths connected in series, and the voltage divider tap of the first semiconductor device is coupled to the control node of the second semiconductor device.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIG. 1 illustrates one embodiment of a cascode circuit with a first semiconductor device and a second semiconductor device;

FIG. 2 shows timing diagrams that illustrate one way of operation of the cascode circuit shown in FIG. 1;

FIG. 3 illustrates another embodiment of a cascode circuit with a first semiconductor device and a second semiconductor device;

DETAILED DESCRIPTION

Figure 4:
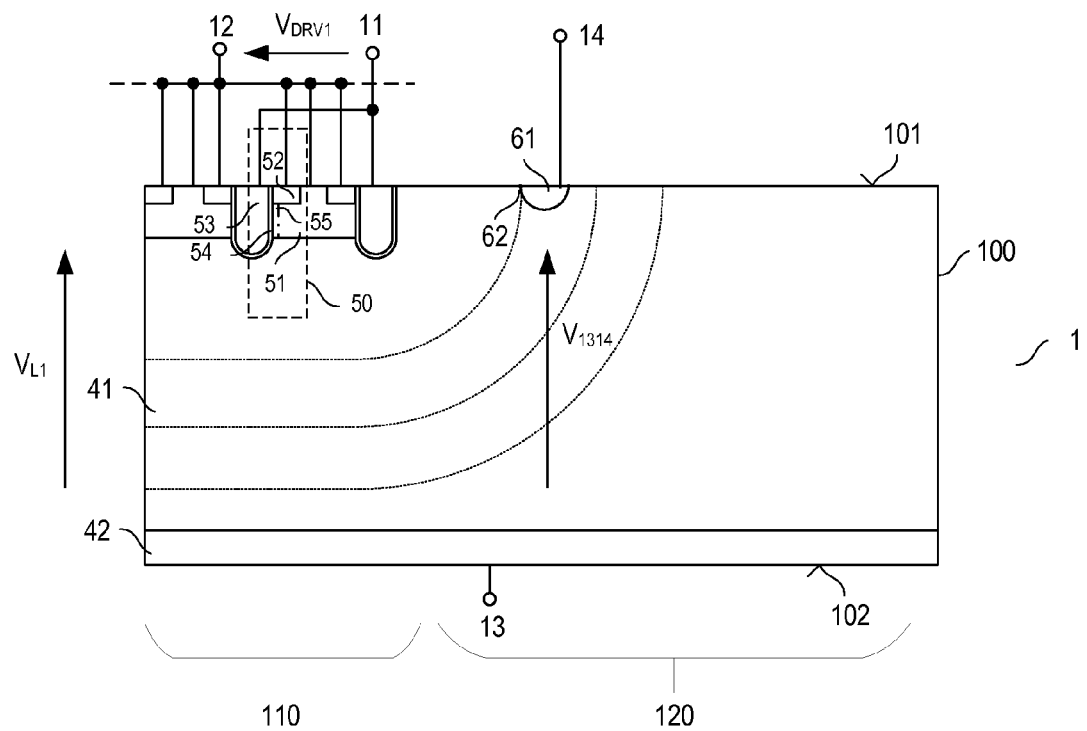
FIG. 4 schematically illustrates a vertical cross sectional view of a section of the first semiconductor device according to one embodiment.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

FIG. 1 illustrates one embodiment of an electronic circuit, in particular, a cascode circuit. The cascode circuit shown in FIG. 1 includes a first semiconductor device 1, and a second semiconductor device 2. The first semiconductor device 1 includes a load path between a first load node 12 and a second load node 13, and an internal voltage divider with a voltage divider tap 14. The second semiconductor device 2 includes a load path between a first load node 22 and a second load node 23, and a control node 21. The load paths of the first semiconductor device 1 and the second semiconductor device 2 are connected in series. Further, the voltage divider tap 14 of the first semiconductor device 1 is coupled to the control node 21 of the second semiconductor device 2.

In the embodiment shown in FIG. 1, the second semiconductor device 2 is implemented as a MOSFET (Metal Oxide Semiconductor Field-Effect Transistor). In this case, the first load node 22 corresponds to a source node, the second node load 23 corresponds to a drain node, and the control node 21 corresponds to a gate node of the MOSFET 2. The MOSFET 2 shown in FIG. 1 is drawn as a depletion (normally-on) MOSFET. However, implementing the second semiconductor device 2 as a normally-on MOSFET is only an example. Any other type of normally-on transistor device such as, for example, a JFET (Junction Field-Effect Transistor) may be used as well. Although the second semiconductor device 2 is drawn as an n-type transistor device, it should be noted, that the second semiconductor device 2 could be implemented as a p-type transistor device as well.

The second semiconductor device 2 is a voltage-controlled semiconductor device which switches on and off dependent on a drive voltage $V_{DRV2}$ received between the control node (gate node) 21 and the first load node (source node) 22. The first semiconductor device and the second semiconductor device 2 are connected in series such that the drive voltage $V_{DRV2}$ the second semiconductor device 2 receives corresponds to a voltage between the voltage divider tap 14 and the second load node 13 of the first semiconductor device 1.

In the embodiment shown in FIG. 1, the first semiconductor device 1 is implemented as a transistor device, specifically as a MOSFET and, more specifically, as an n-type MOSFET. In this case, the first load node 12 is a source node, and the second load node 13 is a drain node. The first semiconductor device 1 further includes a control node 11 which is formed by a gate node of the first semiconductor device implemented as a MOSFET. The first semiconductor device 1 is configured to receive a drive voltage $V_{DRV1}$ between the control node 11 and first load node 12 and switches on and off dependent on a voltage level of this drive voltage $V_{DRV1}$. The first semiconductor device 1 shown in FIG. 1 is drawn as an enhancement (normally-off) MOSFET. However, the first semiconductor device 1 is not restricted to be implemented as a normally-off transistor device, but may be implemented as a normally-on transistor device as well. Further, the first semiconductor device 1 is not restricted to be implemented as a MOSFET, any other type of transistor device such as, for example, a JFET, a BJT (Bipolar Junction Transistor), an IGBT (Insulated Gate Bipolar Transistor) may be used as well. Moreover, the first semiconductor device is not even restricted to be implemented as a transistor device, but could also be implemented as a diode. This is explained with reference to FIG. 3 in further detail herein below.

Referring to FIG. 1, the cascode circuit 3 includes a load path which is formed by the series circuit with the load paths of the first semiconductor device 1, and the second semiconductor device 2. This load path of the cascode circuit 3 is connected between a first load node 32 and a second load node 33 of the cascode circuit 3. The cascode circuit 3 further includes a control node 31 which is connected to the control node 11 of the first semiconductor device 1. The cascode circuit 3 may be used as an electronic switch that switches on and off based on a drive voltage $V_{DRV1}$ received between control node 31 and the first load node 32 of the cascode circuit 3, wherein this drive voltage equals the drive voltage $V_{DRV1}$ of the first semiconductor device 1 in the embodiment shown in FIG. 1. In a switched-on state (briefly referred to as on-state in the following) the load path of the cascode circuit 3 conducts so that a current may flow through the load path. In a switched-off mode (briefly referred to as off-mode in the following) the load path blocks so as to prevent a current from flowing through the load path.

One way of operation of the cascode circuit 3 shown in FIG. 1 is explained below with reference to timing diagrams shown in FIG. 2. Just for the purpose of this explanation it is assumed that the cascode circuit 3 has its load path connected in series with an electrical load Z, and that the series circuit with the cascode circuit 3 and the load Z is connected between supply terminals which receive supply potentials such as, for example, a reference potential GND and the positive supply potential V+, respectively. However, this is only an example. The cascode circuit 3, like a conventional electronic switch, may be used in a variety of other circuit topologies (not shown in the Figures) as well.

FIG. 2 schematically illustrates timing diagrams of the drive voltage $V_{DRV1}$ and a load path voltage $V_{L1}$ of the first semiconductor device 1, and the drive voltage $V_{DRV2}$ and a load path voltage $V_{L2}$ of the second semiconductor device 2. The load path voltage $V_{L1}$ of the first semiconductor device 1 is the voltage between the second load node 13 and the first load node 12. Consequently, the load path voltage $V_{L2}$ of the second semiconductor device 2 is the voltage between the second load node 23 and the first load node 22.

Just for the purpose of explanation it is assumed that a voltage level of the drive voltage $V_{DRV1}$ which switches on the first semiconductor device 1 is a high level, and that a voltage level of the drive voltage $V_{DRV1}$ which switches off the first semiconductor device is a low-level. In FIG. 2, t1 denotes a time at which the drive voltage $V_{DRV1}$ switches the first semiconductor device 1 from the on-state to the off-state. This is schematically illustrated by the voltage level of the drive voltage $V_{DRV1}$ dropping from the high-level to the low-level at t1. During the on-time (which is the time when the drive signal $V_{DRV1}$ has the on-level) of the first semiconductor device 1, the load path voltage $V_{L1}$ of the first semiconductor device 1 is very low as compared to the voltage blocking capability of the first semiconductor device 1, and is drawn to be substantially zero (0) in the timing diagram of the load path voltage $V_{L1}$ shown in FIG. 2. Consequently, a voltage $V_{13-14}$ between the second load node 13 and the voltage divider tap 14 is substantially zero (0) during the on-time of the first semiconductor device 1. This causes the second semiconductor device 2 to be in the on-state when the first semiconductor device 1 is in the on-state. The voltage between the second load node 13 and the voltage divider tap 14 will be referred to as tap voltage $V_{13-14}$ in the following. The drive voltage $V_{DRV2}$ of the second semiconductor device 2 corresponds to the inverted tap voltage, that is $$V_{DRV2} = -V_{13-14}$$

In the present embodiment, the second semiconductor device 2 is a normally-on device, which means that the second semiconductor device 2 is in the on-state when the voltage level of the drive voltage $V_{DRV2}$ is 0. An n-type normally-on transistor device such as, for example, the depletion MOSFET shown in FIG. 1, switches off when the voltage level of the drive voltage decreases to a negative pinch-off level. The negative pinch-off level of the second transistor device 2 will be referred to as $V_{PO2}$ in the following.

As the first semiconductor device 1 switches off at time t1 the load path of the first semiconductor device 1 blocks so that the load path voltage $V_{L1}$ starts to increase. It should be noted that in FIG. 2 the load path voltage is only schematically illustrated. As the load path voltage $V_{L1}$ increases, the voltage level of the drive voltage $V_{DRV2}$, at first, substantially stays at zero (0) causing the second semiconductor device 2 to be kept in the on-state. When the level of the load path voltage $V_{L1}$ of the first semiconductor device 1 reaches a level significantly above zero (0) the tap voltage $V_{13-14}$ starts to increase and, consequently, the drive voltage $V_{DRV2}$ of the second transistor device 2 starts to decrease. This effect is explained with reference to different embodiments of the first semiconductor device 1 below. The second semiconductor device switches off as the drive voltage $V_{DRV2}$ reaches the pinch-off voltage $V_{PO2}$. At this time, the load path voltage $V_{L2}$ of the second semiconductor device 2 starts to increase. The load path voltage $V_{L1}$ of the first semiconductor device may further increase until the second semiconductor device 2 switches off. After the second semiconductor device 2 has switched off, the load path voltage $V_{L2}$ of the second semiconductor device 2 increases until the first load path voltage $V_{L1}$ plus the second load path voltage $V_{L2}$ equals the supply voltage. As shown with dotted lines in FIG. 2, the drive voltage $V_{DRV2}$ of the second transistor device 2 may decrease to a value lower than the pinch-off voltage $V_{PO2}$. Also, the load path voltage $V_{L1}$ may further increase after the pinch-off voltage $V_{PO2}$ has been reached.

FIG. 3 illustrates a further embodiment of the cascode circuit 3. In this embodiment, the first semiconductor device 1 is implemented as a diode with a load path between a first load node 12 and a second load node 13, and with a voltage divider tap 14. The voltage divider tap 14 of the diode 1 is connected to the control node 21 of the second semiconductor device 2. Like in the embodiment shown in FIG. 1, the second semiconductor device 2 shown in FIG. 3 is implemented as a depletion MOSFET 2. However, any other type of normally-on transistor device may be used as well. In this regard, reference is made to FIG. 1 and the corresponding description.

Like the cascode circuit shown in FIG. 1, the cascode circuit 3 shown in FIG. 3 can operate in a conducting state in which the cascode circuit 3 allows a current to flow between the first and second load nodes 32, 33, and in a blocking state in which the cascode circuit 3 prevents a current from flowing between the first and second load nodes 32, 33. Further, like in the cascode circuit shown in FIG. 1, the operation state of the cascode circuit shown in FIG. 3 is governed by the first semiconductor device 1. That is, the cascode circuit is in the conducting state (on-state) when the first semiconductor device 1 is in the on-state, and the cascode circuit 3 is in the blocking state (off-state) when the first semiconductor device 1 is in the off-state. However, unlike the cascode circuit shown in FIG. 1, the operation state of the cascode circuit 3 is not defined by a drive signal corresponding to the drive signal $V_{DRV1}$ explained with reference to FIG. 1, but the operation state of the cascode circuit 3 shown in FIG. 3 is only dependent on the polarity of a voltage applied between the first and second load nodes 32, 33. In the embodiment shown in FIG. 3, the first load node 12 of the first semiconductor device 1 corresponds to an anode of the diode and is connected to the first load node 32 of the cascode circuit 3. In this embodiment, the diode 1 blocks when a voltage between the second load node 33 and the first load node 32 has a first polarity (is positive), and the diode 1 conducts when this voltage between the second load node 33 and the first load node 32 has a second polarity (is negative). When the diode 1 conducts, a load path voltage $V_{L1}$ is negative in the embodiment shown in FIG. 3. Consequently, the tap voltage $V_{13-14}$ is negative and the drive voltage $V_{DRV2}$ of the second transistor device 2 is positive. When the diode 1 blocks so that the load path voltage $V_{L1}$ increases, the second transistor device starts to block when the inverted tap voltage reaches the pinch-off voltage of the second transistor device 2.

FIG. 4 shows a vertical cross sectional view of a section of a first semiconductor device 1 implemented as a transistor device, in particular, as a MOSFET. Referring to FIG. 4, the first semiconductor device 1 includes a semiconductor body 100 with a first surface 101 and a second surface 102 opposite the first surface 101. FIG. 4 shows the first semiconductor device 1 in a vertical section plane, which is a section plane perpendicular to the first and second surfaces 101, 102. The semiconductor body 100 includes an inner region 110 and an edge region 120.

Figure 5:
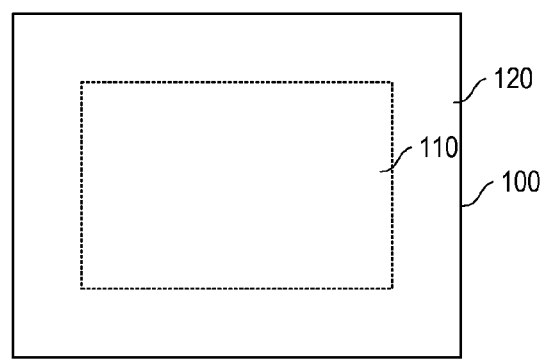
FIG. 5 schematically illustrates a top view of the semiconductor device shown in FIG. 3.

Referring to FIG. 5 which schematically illustrates a top view of the semiconductor body 100, the edge region 120 surrounds the inner region 110. That is, the edge region 120 terminates the first semiconductor device 1 implemented in the semiconductor body 100 in a lateral direction of the semiconductor body 100. According to one embodiment, the edge region 120 adjoins an edge surface of the semiconductor body 100 on those sides which face away from the inner region 110. The "edge surface" is a surface that terminates the semiconductor body 100 in lateral directions. According to another embodiment, besides the first semiconductor device 1, at least one further semiconductor device (not shown) is implemented in the semiconductor body 100. In this embodiment, the edge region 120 is arranged between the inner region 110 and those regions of the semiconductor body 100 where the at least further semiconductor device is implemented.

Referring to FIG. 4, the MOSFET includes a drift region 41 of a first doping type in the inner region 110 and the edge region 120, and a drain region 42 at least in the inner region 110. In the embodiment shown in FIG. 4, the drain region 42 is implemented in the inner region 110 and the edge region 120. According to another embodiment (not shown) the drain region 42 is omitted at least in a part of the edge region 120. The drain region 42 may adjoin the drift region 41. According to a further embodiment (illustrated in dashed lines in FIG. 4) a field-stop region 43 of the same doping type as the drift region 41, but more highly doped than the drift region 41 is arranged between the drift 41 and the drain region 42. The doping concentration of the drift region 41 is, for example, between $1E13$ cm$^{-3}$ and $1E18$ cm$^{-3}$ and, in particular, between $1E15$ cm$^{-3}$ and $1E17$ cm$^{-3}$ and the doping concentration of the drain region 42 is, for example between $1E19$ cm$^{-3}$ and $1E21$ cm$^{-3}$.

Referring to FIG. 4, the MOSFET includes at least one transistor cell 50 in the inner region 110. The transistor cell includes a body region 51 of a second doping type complementary to the first doping type, and a source region 52 of the first doping type. The body region 51 forms a pn-junction with the drift region 41 and separates the source region 52 from the drift region 41. The doping concentration of the source region 52 is, for example, between $1E19$ cm$^{-3}$ and $1E21$ cm$^{-3}$, and the doping concentration of the body region 51 is, for example, between $1E17$ cm$^{-3}$ and $1E19$ cm$^{-3}$.

Referring to FIG. 4, a gate electrode 53 is adjacent the body region 51 and is dielectrically insulated from the body region 51 by a gate dielectric 54. The gate electrode 53 serves to control a conducting channel along the gate dielectric 54 in the body region 51 between the source region 52 and the drift region 41. The source region 52 and, optionally, the body region 51 are electrically connected to the first load node (source node) 12. The drain region 42 is electrically connected to the second load node (drain node) 13, and the gate electrode 53 is electrically connected to the control node (gate node) 11. These individual nodes of the first semiconductor device 1 are only schematically illustrated in FIG. 4.

According to one embodiment, the MOSFET includes a plurality of transistor cells 50 which are connected in parallel by having the source regions 52 connected to the first load node 12, and by having the gate electrodes 53 connected to the control node 11. Further, the individual transistor cells 50 share the drift region 41 and the drain region 42.

The MOS transistor shown in FIG. 4 can be implemented as an n-type transistor device or as a p-type transistor device. In an n-type transistor device the source region 52 and the drift region 41 are n-doped, while the body region 51 is p-doped. In a p-type device the individual device regions are doped complementary to the corresponding device regions in an n-type device. Further, the MOS transistor can be implemented as a MOSFET or as an IGBT. In the MOSFET, the drain region 42 has the same doping type as the drift region 41, and in an IGBT the drain region 42 has a doping type complementary to the doping of the drift region 41. Further, MOS transistor can be implemented as an enhancement device (normally-off device) or as a depletion device (normally-on device). In a normally-off device, the body region 51 adjoins the gate dielectric 54 between the source region 52 and the drift region 41. A normally-on device includes a channel region 55 of the same doping type as the source region 52 and the drift region 41 along the gate dielectric 54 between the source region 42 and the drift region 41. Such channel region 55 is illustrated in dashed and dotted lines in one of the transistor cells shown in FIG. 4.

Referring to FIG. 4, the MOS transistor further includes a tap region 61 of the second doping type in the edge region 120. The tap region 61 is connected to the voltage divider tap 14 and is arranged in the drift region 41 and is spaced apart from the pn-junction between the body region 51 and the drift region 41. In the present embodiment, the tap region 61 is spaced apart from the pn-junction substantially in the lateral direction of the semiconductor body 100 and may adjoin the first surface 101, which is the surface in the region of which the transistor cells 50 are located in the semiconductor body 100.

One way of operation of the MOS transistor shown in FIG. 4 and, in particular, on way of operation of the internal voltage divider with the tap region 61 is explained in the following. Referring to the explanation above, the MOS transistor can be operated in an on-state and an off-state. For the purpose of explanation it is assumed that the MOS transistor is an n-type transistor device and that a positive load voltage $V_{L1}$ is applied between the second load node (drain node) 13 and the first load node (source node) 12.

In the on-state, the level of the drive voltage $V_{DRV1}$ between the control node 11 and the first load node 12 is such that the gate electrode 53 causes a conducting channel between the source region 52 and the drift region 41 along the gate dielectric 54, either by generating an inversion channel in the body region 51 along the gate dielectric (in case of an enhancement device), or by not-depleting the channel region 55 (in case of a depletion device). In this operation mode, the load path voltage $V_{L1}$ is substantially given by the voltage drop across the drift region 41 and is substantially defined by the current through the MOS transistor. This load path voltage is relatively low as compared to the voltage blocking capability of the MOS transistor. For example, the load path voltages in the on-state range between several millivolts and several 100 millivolts in MOS transistors with voltage blocking capabilities ranging between several 10V and several 100 V. In the on-state, the electrical potential at the tap 61 substantially corresponds to the electrical potential at the second load node (drain node) 13 because a current in the edge region 120 is very low as compared to a current in the inner region 110.

In the off-state, the drive voltage $V_{DRV1}$ is such that the gate electrode 53 prevents a conducting channel between the source region 52 and the drift region 41, either by not generating an inversion channel in the body region 51 (in an enhancement device), or by depleting the channel region 55 (in a depletion device. In this case, a voltage applied between the second load node 13 and the first load node 12 reverse biases the pn-junction between the body region 51 and the drift region 41 so that a space charge region (depletion region) expands in the drift region 41 beginning at the pn-junction. This depletion region expands deeper into the drift region 41 as the load path voltage $V_{L1}$ increases. In FIG. 4, the dotted lines schematically illustrate equipotential lines of an electric field associated with the depletion region expanding in the drift region 41. As can be seen from FIG. 4, the depletion region expands in the drift region 41 in the direction of the drain region 42, but also expands in the edge region 120 in the lateral direction of the semiconductor body 100.

According to one embodiment, the tap region 61 is so highly doped that it cannot be depleted completely. Thus, in the off-state, the tap region 61 has an electrical potential that corresponds to the electrical potential the depletion region has at a position where it first reaches the tap region 61. Reference character 62 denotes this position in the embodiment shown in FIG. 4. The tap voltage $V_{13-14}$ corresponds to the difference between the electrical potential of the drain region 42 and the electrical potential of the tap region 61. At a given load path voltage $V_{L1}$ the tap voltage $V_{13-14}$ is substantially dependent on the distance between the tap region 62 and the pn-junction, wherein the tap voltage $V_{13-14}$ decreases as the distance between the pn-junction and the tap region 61 increases. If the load path voltage $V_{L1}$ has a voltage level that is too low for the depletion region to reach the tap region 61, than electrical potential of the tap region 61 substantially corresponds to the electrical potential of the drain region 42, so that the tap voltage $V_{13-14}$ is substantially zero. In this case, the tap voltage $V_{13-14}$ may not be sufficient to switch-off the second semiconductor device 2 (see FIG. 1). In this case, only the first semiconductor device 1 takes over the voltage applied to the load path of the cascode circuit 3.

In the embodiment shown in FIG. 4, the equipotential lines are drawn to have the same distance in the inner region 110 and the edge region 120. However, this is only for the purpose of explanation. The semiconductor device 1 may include means that reduce the electrical field in the edge region 120, in particular along the first surface 101, as compared to the electrical field in the inner region. In this case, equipotential lines in the lateral direction along the first surface 101 are more spaced apart than in the vertical direction in the inner region. That is, in the off-state, a distance between the pn-junction and the position of the maximum electrical potential (drain potential) may be shorter in the inner region 110 than in the edge region 120. Thus, the dimension of the edge region 120 in the lateral direction may be larger than the shortest distance between the pn junction and the drain region 42.

According to one embodiment, a (shortest) distance between the pn junction and the tap region is longer than 50%, 75%, or even 90% of a (shortest) distance between the pn junction and the drain region 42, but shorter than 110%, 150%, or 200% of the (shortest) distance between the pn junction and the drain region 42. If the distance between the pn junction and the tap 61 is longer than 100% of the distance between the pn junction and the drain region 42 there can be different electrical potentials at the tap 61 and the drain region 42 in those cases in which there are means which the electrical field along the first surface 101 as compared to the inner region 110.

In general, a (shortest) distance between the pn junction and the tap region is longer than 50%, 75% or 90% and shorter than 200%, 150%, or 110% of a (shortest) length of the drift region in the current flow direction of the first semiconductor device. This also applies to other embodiments of the first semiconductor device 1 explained herein below. The "length of the drift region 41 in the current flow direction" is the dimension of the drift region 41 in the direction in which the current flows through the drift region in the on-state of the first semiconductor device 1. In the embodiment shown in FIG. 4, as well as in the embodiments explained below, the current flow direction corresponds to the vertical direction of the semiconductor body 100.

Figure 6:
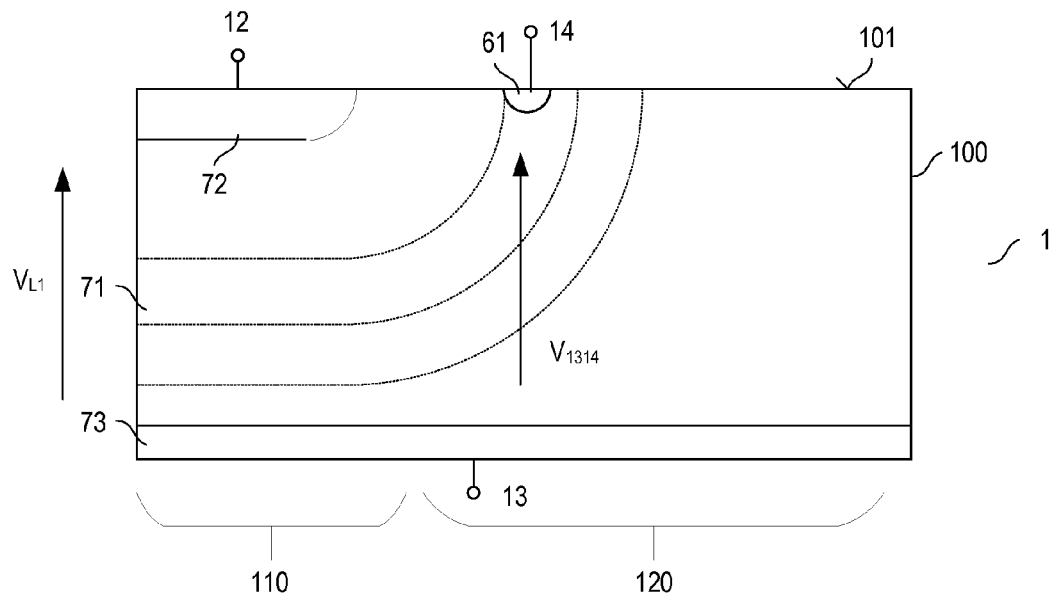
FIG. 6 schematically illustrates a vertical cross sectional view of a section of the first semiconductor device according to another embodiment.

FIG. 6 illustrates a vertical cross sectional view of one embodiment of a first semiconductor device 1 implemented as a diode. Like the MOS transistor shown in FIG. 4, the diode includes a drift region (which may also be referred to as base region) 71 of a first doping type in the inner region 110 and the edge region 120 of the semiconductor body 100. A first emitter region 72 is arranged in the inner region 110 and has a doping type complementary to the doping type of the base region 71, so that the first emitter region 72 forms a pn-junction with the base region 71 in the inner region 110 of the semiconductor body 100. The first emitter region 72 is connected to the first load node 12. A second emitter region 73 of the same doping type as the base region 71, but more highly doped than the base region 71, joins the base region 71 on a side opposite the first emitter region 72. The second emitter region 73 is connected to the second load node 13. Like in the MOS transistor shown in FIG. 5 the tap region 61 is arranged in the edge region 120 spaced apart from the pn-junction which is formed between the first emitter region 72 and the base region 71.

For the purpose of explanation it is assumed that the first emitter region 72 is p-doped, and that the base region 71 and the second emitter region 73 are n-doped. In this embodiment, the diode conducts when a voltage is applied between the first and second load nodes 12, 13 that forward biases the pn-junction. In this case, the electrical potential of the tap region 61 substantially corresponds to the electrical potential of the second emitter region 73, so that the tap voltage $V_{13-14}$ is substantially zero. When the load path voltage $V_{L1}$ reverse biases the pn-junction, a depletion region (represented by dotted equipotential lines in FIG. 6) expands in the base region 71. In this operation state of the diode, the tap voltage $V_{13-14}$ becomes positive when the depletion region expands beyond the tap region 61 (as illustrated in FIG. 6).

Figure 7:
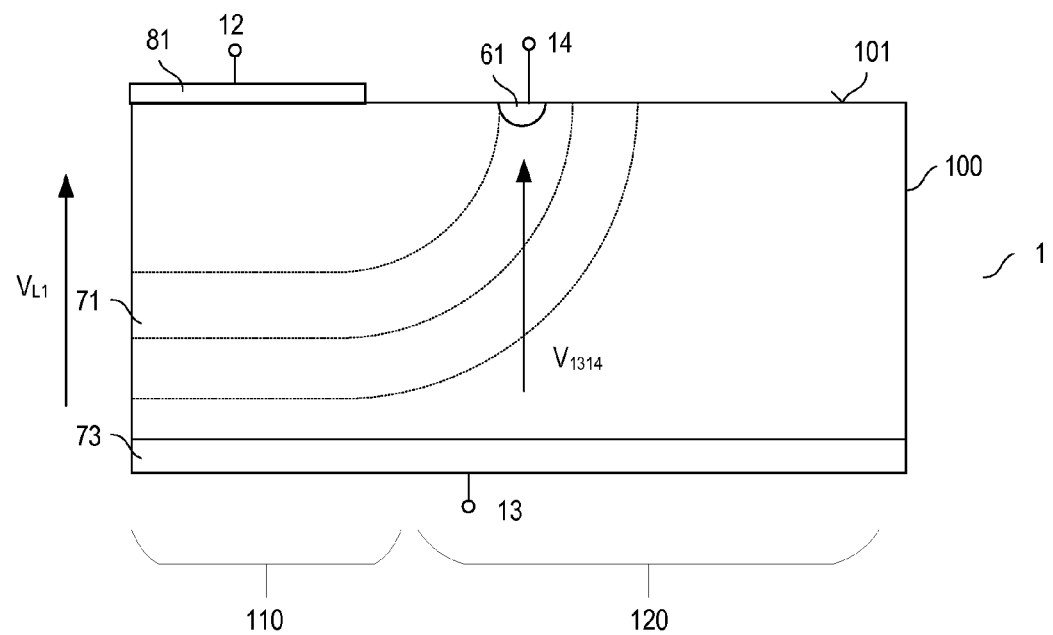
FIG. 7 schematically illustrates a vertical cross sectional view of a section of the first semiconductor device according to yet another embodiment.

According to a further embodiment, shown in FIG. 7, the diode is implemented as a Schottky diode. Basically, the Schottky diode is different from the pn-diode shown in FIG. 6 in that the Schottky diode instead of the first emitter region (72 in FIG. 6) includes a Schottky metal 81 on the first surface 101 which forms a Schottky contact with the base region 71. The Schottky diode shown in FIG. 7 operates like the pn-diode shown in FIG. 6. That is, dependent on the polarity of the load path voltage $V_{L1}$ the Schottky diode either conducts or blocks. In the embodiment shown in FIG. 7, the Schottky diode blocks when the load path voltage $V_{L1}$ is positive (that is, when the load path voltage $V_{L1}$ has the polarity shown in FIG. 7), and conducts when the load path voltage $V_{L1}$ is negative (that is, when the load path voltage $V_{L1}$ has a polarity opposite the polarity shown in FIG. 7). When the Schottky diode blocks, a space charge region (depletion region) expands in the base region 71 as illustrated by the dotted equipotential lines shown in FIG. 7.

Figure 8:
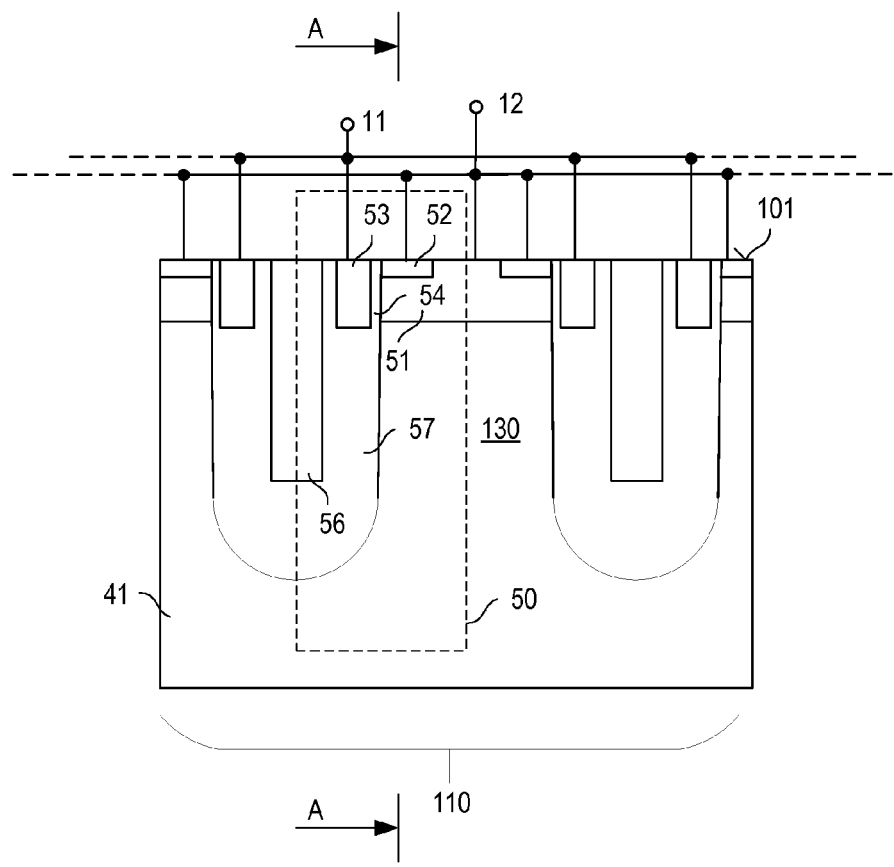
FIG. 8 illustrates a modification of an inner region of the semiconductor device shown in FIG. 4.

Although one embodiment of a transistor cell 50 is shown in FIG. 5 it should be noted that this is only for purpose of illustration. The MOS transistor may be implemented with any type of transistor cell. FIG. 8 illustrates another embodiment of a transistor cell 50. In this embodiment, the transistor cell 50, additionally to the body region 51, the source region 52, the gate electrode 53 and the gate dielectric 54 includes a field electrode 56 which extends into the drift region 41 and is dielectrically insulated from the drift region 41 by a field electrode dielectric 57. The field electrode 56 may either be connected to the first load node (source node) 12, or the control node (gate node) 11. However, none of these connections is explicitly shown in FIG. 8.

The purpose of the field electrode 56 is to provide countercharges to dopant charges in the drift region 41 when the MOS transistor is in the off-state, that is, when the depletion region expands in the drift region 41. Thus, the drift region 41 may be implemented with a higher doping concentration than a conventional device without field electrode, so as to reduce the on-resistance of the MOS transistor.

Figure 9:
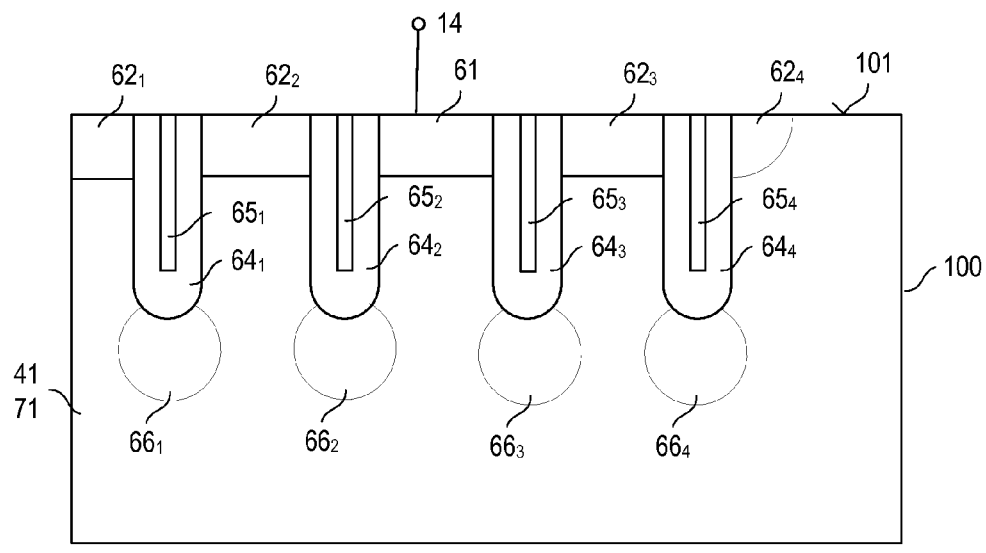
FIG. 9 illustrates a modification of an outer region of one of the semiconductor devices shown in FIGS. 4, 5, and 7.

FIG. 9 illustrates another embodiment of an edge region 120 of the first semiconductor device. This edge region may be employed in any of the first semiconductor devices explained herein before.

In the embodiment shown in FIG. 9, the tap region 61 is located in a semiconductor mesa region between two trenches, with each of these two trenches including a field electrode 65$_2$, 65$_4$ which is dielectrically insulated from the drift region 41, 71 by a field electrode dielectric 64$_2$, 64$_3$.

According to one embodiment, the field electrodes 65$_1$-65$_4$ are electrically floating, that is, they are not electrically connected to one of the terminals or semiconductor regions of the semiconductor device.

Optionally, besides the tap region 61, the edge region 120 includes further doped regions 62$_1$-62$_4$ of a doping type complementary to the drift region 41, 71 along the first surface 101. These doped regions 62$_1$-62$_4$ will also be referred to as inner doped regions in the following. In the embodiment shown in FIG. 9, each of these further semiconductor regions 62$_1$-62$_4$ is arranged adjacent at least one trench with a field electrode and a field electrode dielectric. In the embodiment shown in FIG. 9, besides the two trenches that form the mesa region in which the tap region 61 is located, there are two additional trenches with field electrodes 65$_1$, 65$_4$ and field electrode dielectrics 64$_1$, 64$_4$. Each of these additional trenches form mesa regions with the trenches that are arranged adjacent the tap region 61, wherein two of the semiconductor regions, namely semiconductor regions 62$_2$, 62$_3$, are located in mesa regions between to neighboring trenches. According to one embodiment, at least one of the field electrodes 65$_1$-65$_4$ is electrically connected to one inner region. For example, the at least one field electrode is connected to the inner doped region 62$_1$-62$_4$ which is adjacent the at least one field electrode in the direction of the pn junction. As an example, field electrode 65$_1$ may be connected to the inner doped region 62$_1$. According to another embodiment, each of the field electrodes 65$_1$-65$_4$ is connected to the inner doped region 62$_1$-62$_4$ which is adjacent in the direction of the pn junction. According to yet another embodiment, the field electrodes 65$_1$-65$_4$ are floating.

Referring to FIG. 9, there is a semiconductor mesa region between two neighboring trenches, with each of these trenches including one of the field electrodes 65$_1$-65$_4$ and the corresponding field electrode dielectric 64$_1$-64$_4$. As shown in FIG. 9, each of the optional doped inner regions 62$_1$-62$_4$ may adjoin the field electrode dielectric 64$_1$-64$_4$ on both opposite sides of the mesa region. According to another embodiment (not shown), at least one of the doped inner regions 62$_1$-62$_4$ is spaced apart from the field electrode dielectrics 64$_1$-64$_4$ so that sections of the drift region 41 extend to the first surface between the doped inner regions 62$_1$-62$_4$ and the adjacent field electrode dielectrics 64$_1$-64$_4$.

The trenches with the field electrodes 65$_1$-65$_4$ and the corresponding field electrode dielectrics 64$_1$-64$_4$ may each have the form of a ring that surrounds the inner region 110. The ring can be rectangular (optionally with rounded corners), polygonal, elliptical, circular, or the like.

Figure 10:
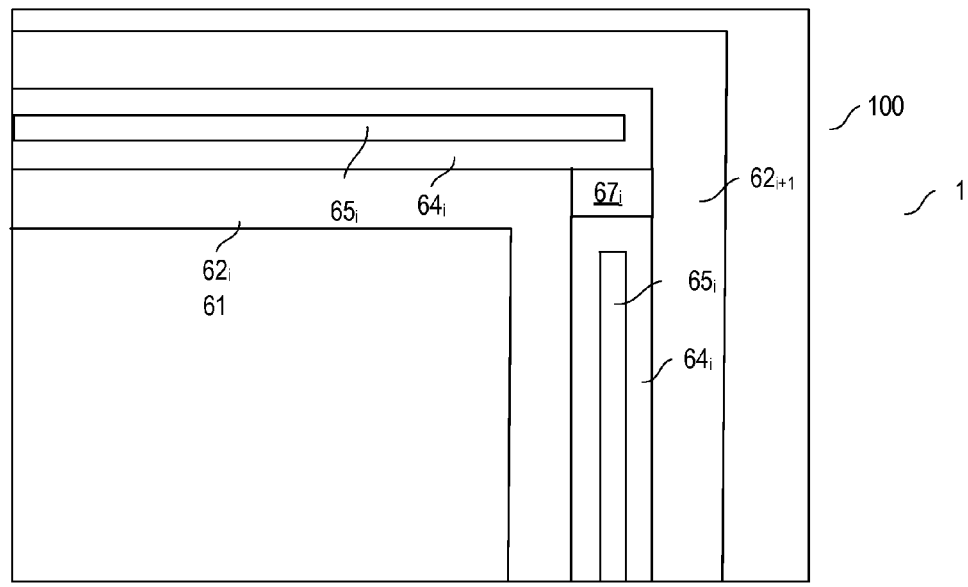
FIG. 10 shows a top view of one section of an outer region according to one embodiment.

According to another embodiment, the trenches are elongated trenches, with four or more of these elongated trenches forming a ring structure which surrounds the inner region. FIG. 10 schematically shows a top view of two of four of those elongated trenches surrounding the inner region 110. In FIG. 10, 65$_i$ denotes the field electrode, and 64$_i$ denotes the corresponding field electrode dielectric in each of these elongated trenches. Optionally, there is at least one further trench including a field electrode and a field electrode dielectric parallel to each of these trenches so as to form at least one further ring structure.

Referring to FIG. 10, the elongated trenches are spaced apart in corner regions of the ring structure. The "corner regions" are those regions where two elongated trenches are adjacent. The shortest distance between two elongated trenches of one ring structure can be different from the distance between the trenches of two neighboring ring structures shown in FIG. 9. In FIG. 10, 62$_{i+1}$ denotes another doped inner region adjacent the trench. This doped inner region $62_{i+1}$ is separated from the tap region 61 or the inner region $62_{i+1}$, respectively, either by the trench (not shown) or by a doped region 67, (as shown) of a complementary doping type.

Figure 11:
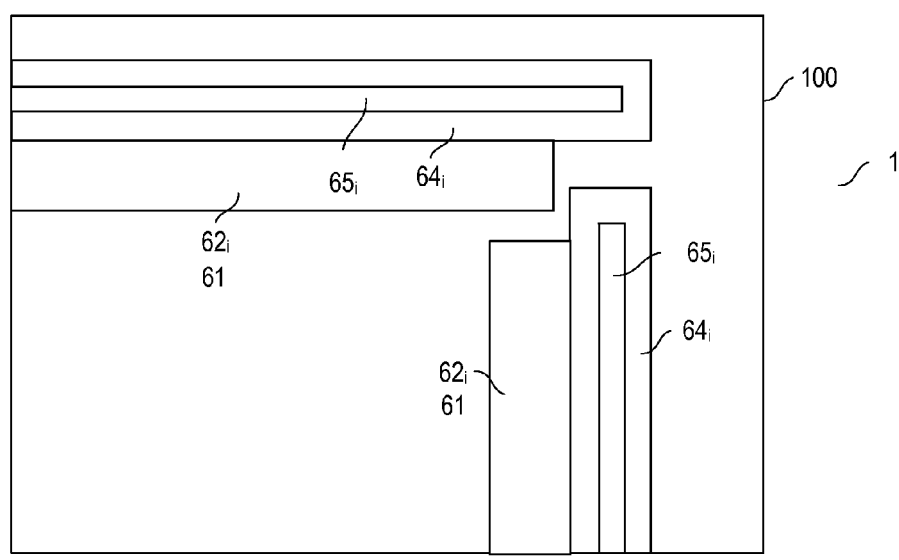
FIG. 11 shows a top view of one section of an outer region according to another embodiment.

Referring to FIG. 10, the tap region 61 or the optional doped inner region $62_i$, respectively, may have the form of a ring. This ring may adjoin the elongated trenches (as illustrated). According to another embodiment (not shown), the tap region 61 and the optional doped inner region $62_i$, respectively, are spaced apart from the elongated trenches. According to another embodiment shown in FIG. 11, the tap region 61 or one doped inner region $62_i$ includes elongated regions which are spaced apart in the corner regions. Those elongated regions may adjoin the trenches (as shown), or be spaced apart from the trenches (not shown).

Referring to FIG. 9, optionally there are doped semiconductor regions $66_1$-$66_4$ of a doping type complementary to the drift region 41, 71 located below the trenches. According to one embodiment, a doping concentration of these regions $66_1$-$66_4$ is such that these semiconductor regions $66_1$-$66_4$ in the off-state of the semiconductor device can be depleted completely. According to one embodiment, these semiconductor regions $66_1$-$66_4$ are floating. Although FIG. 9 shows a doped region $66_1$-$66_4$ below each of the trenches this is only an example. According to one embodiment, a doped region corresponding to one of the regions $66_1$-$66_4$ shown in FIG. 9 is located below at least one of the trenches but not below each of the trenches. For example, a doped region is located below a first trench which is located between the inner region and a second trench, and there is no such doped region below the second trench.

In the embodiments explained herein before, the tap region 61 is located in the edge region 120 of the semiconductor device, wherein the edge region 120 surrounds the inner region 110. In the inner region 110 active device regions such as for example, transistor cells in case of a transistor device, an emitter region in case of a diode, or a Schottky metal in case of a Schottky diode or a combination of the aforementioned are located. However, arranging the tap region 61 in the edge region 120 of the semiconductor device is only one example.

In a semiconductor device with a topology as shown in FIG. 8, the tap region 61 may be located in the mesa region 130 spaced apart from the body region 51.

Figure 12:
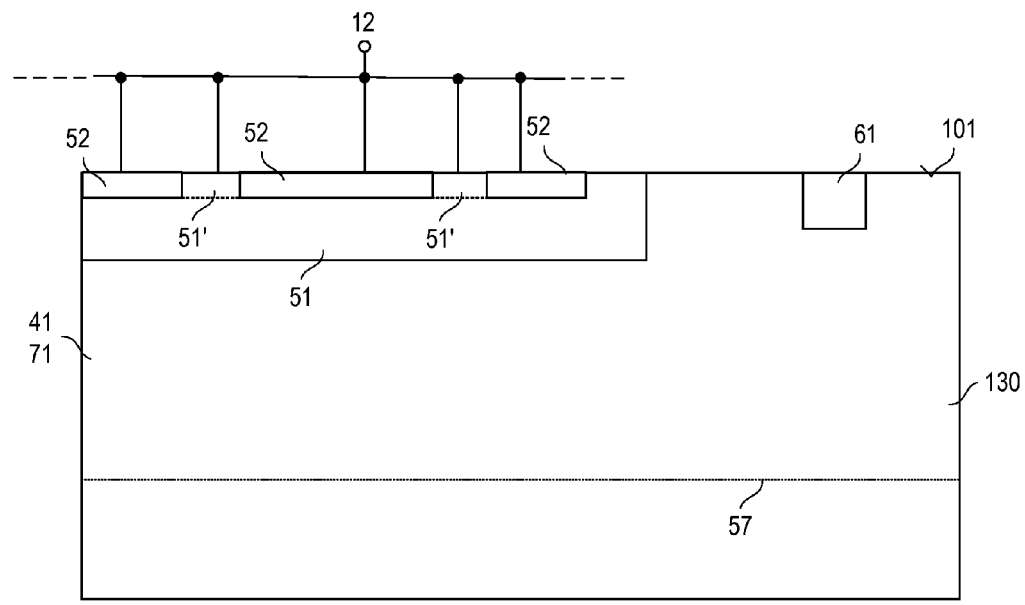
FIG. 12 illustrates one embodiment of an internal voltage divider of the first semiconductor device.

FIG. 12 shows a vertical cross sectional view of such mesa region 130 in a section plane A-A shown in FIG. 8. This section plane A-A cuts through the mesa region 130 in a longitudinal direction of the mesa region 130. In FIG. 12, reference character 57 denotes the lower end of the field electrode dielectric 57, which corresponds to the lower end of the trenches forming the mesa region 130. As can be seen from FIG. 10, the body region 51 (and the source region 52 arranged in the body region 51) do not extend along the complete length of the mesa region 130. The tap region 61 is located in the mesa region 130 spaced apart from the body region 51 in the lateral direction of the semiconductor body 100 and adjoining the first surface 101. According to one embodiment, there is one body region 51 in each mesa region 130. This body region, as shown in FIG. 10, has a longitudinal end distant to the tap region 61.

Figure 13:
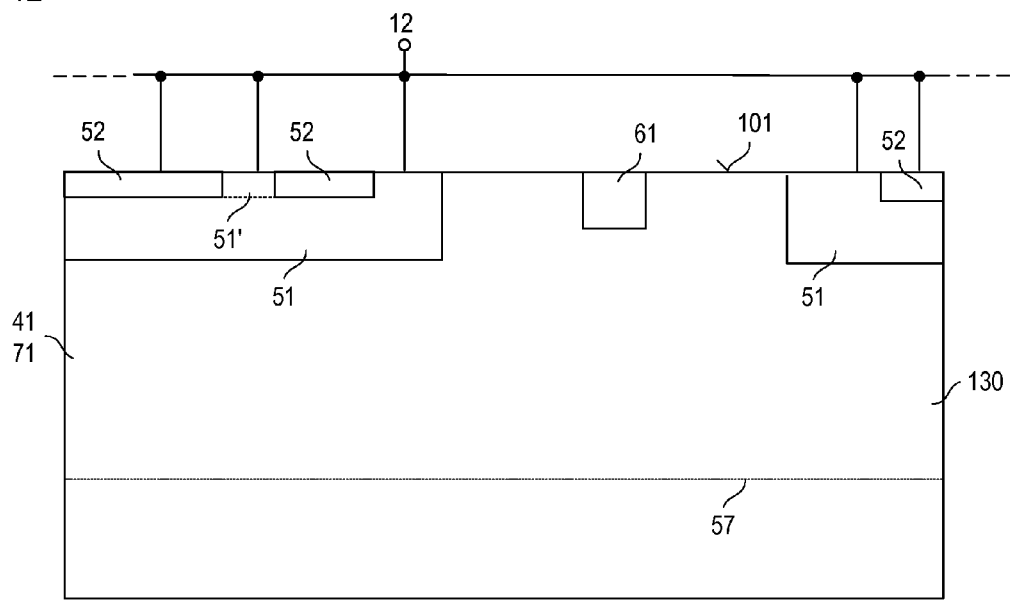
FIG. 13 illustrates another embodiment of an internal voltage divider of the first semiconductor device.

According to another embodiment, shown in FIG. 13, the body region 51 includes at least two body region sections in the mesa region 130. In this embodiment, the tap region 61 is arranged between these two body region sections and spaced apart from each of these body region sections in the lateral direction of the semiconductor body. In each of the embodiments shown in FIGS. 12 and 13, the (shortest) distance between the body region 51 and the tap region is as explained before. That is, the distance is longer than 50%, 75%, or 90% and shorter than 110%, 150%, or 200% of the (shortest) distance between the body region 52 and the drain region 41.

Referring to FIGS. 12 and 13, the body region 51 or one body region section 51, respectively, may include one source region 52. According to another embodiment (shown in dotted lines in FIGS. 12 and 13), there are several source regions which are spaced apart and each connected to the first load terminal 12. The load terminal 12 may be connected to the body region 51 in sections between the source regions 52. Optionally, there are higher doped body contact regions 51' between the source regions 52, and the first load terminal is connected to those contact regions 51'.

According to one embodiment, the semiconductor device includes a plurality of semiconductor mesa regions, with each mesa region including at least one body region 51 and at least one source region 52 in each body region 51. According to one embodiment, there is a tap region in at least one but less than all of the mesa regions. According to another embodiment, there is a tap region in each of the mesa region. In case there are two or more tap regions, these tap regions 61 are connected to the tap 14 of the device.

Figure 14:
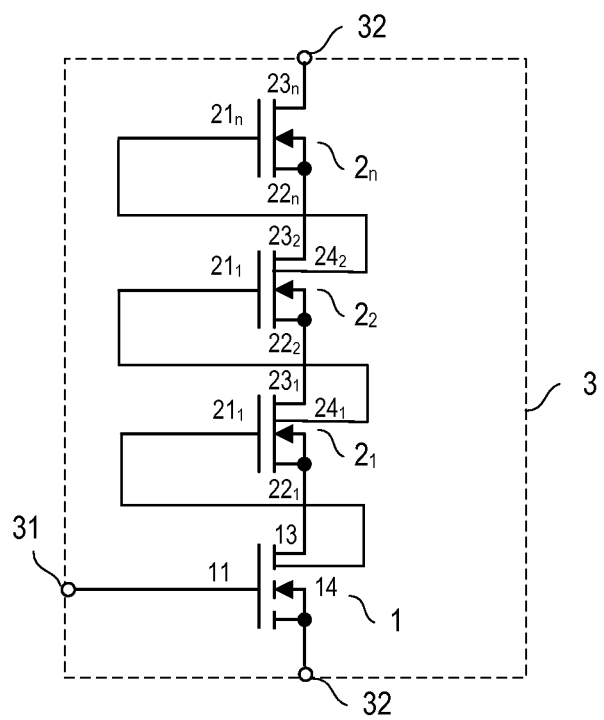
FIG. 14 illustrates another embodiment of a cascode circuit.

FIG. 14 illustrates a further embodiment of a cascode circuit 3. In this embodiment, the cascode circuit 3 includes one first semiconductor device 1 and several second semiconductor devices $2_1$-$2_n$. Each of these second semiconductor devices $2_1$-$2_n$ includes a control node $21_1$-$21_n$ and a load path between a first load node $22_1$-$22_n$, and a second load node $23_1$-$23_n$. The load paths of the second semiconductor devices $2_1$-$2_n$ are connected in series, and connected in series with a load path of the first semiconductor device 1. This series circuit formed by the load path of the first semiconductor device 1 and the load paths of the second semiconductor devices $2_1$-$2_n$ is connected between the load nodes 32, 33 of the cascode circuit 3. The first semiconductor device 1 is implemented as a transistor device in the embodiment shown in FIG. 14. However, this is only an example, any other type of semiconductor device that may be used as the first semiconductor device 1 could be used as well. The voltage divider tap 14 of the first semiconductor device 1 is connected to the control node $21_1$ of the second semiconductor device $2_1$ that has its load path directly connected to the load path of the first semiconductor device 1. This second semiconductor device $2_1$ is also implemented with a voltage divider tap $24_1$ wherein this voltage divider tap $24_1$ is connected to the control node $21_2$ of the second semiconductor device $2_2$ which has its load path directly connected to the load path of the semiconductor device $2_1$. The voltage divider tap $24_2$ of the second semiconductor device $2_2$ is connected to the control node $21_n$ of the second semiconductor device $2_n$. In the embodiment shown in FIG. 14, there are n=3 second semiconductor devices. However, this is only an example. The number of second semiconductor devices connected in series is selected arbitrarily. In general, in a cascode circuit 3 with n second semiconductor devices, there are n−1 semiconductor devices which are implemented with a voltage divider tap, wherein the voltage divider tap of each of these second semiconductor devices is connected to the control node of the directly adjacent second semiconductor device. The "directly adjacent second semiconductor device" is the semiconductor device which has its load path directly connected to the load path of the semiconductor device with the voltage divider tap. The second semiconductor devices with a voltage divider tap, such as the second semiconductor devices $2_1$-$2_2$ can be implemented as explained with reference to the first semiconductor device 1 herein before. According to one embodiment, these second semiconductor devices $2_1$-$2_2$ are depletion MOS- FETs, in particular, n-typed depletion MOSFETs. According to another embodiment, each of the second semiconductor devices $2_1$-$2_2$ is implemented with a voltage divider tap. However, the tap of the uppermost device $2_n$ is simply not connected (open loaded).

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronic circuit, comprising:
    a first semiconductor device comprising a load path, and an internal voltage divider with a voltage divider tap; and
    a second semiconductor device comprising a load path and a control node,
    wherein the first semiconductor device and the second semiconductor device have their load paths connected in series and wherein the voltage divider tap of the first semiconductor device is coupled to the control node of the second semiconductor device.

2. The electronic circuit of claim 1, wherein the first semiconductor device further includes a control node.

3. The electronic circuit of claim 1, wherein the second semiconductor device is a transistor.

4. The electronic circuit of claim 3, wherein the transistor is selected from the group consisting of:
    a MOSFET;
    a JFET; and
    an IGBT.

5. The electronic circuit of claim 4, wherein the MOSFET is a normally-on MOSFET.

6. The electronic circuit of claim 1, wherein the first semiconductor device is a transistor.

7. The electronic circuit of claim 6, wherein the transistor is selected from the group consisting of:
    a MOSFET;
    a JFET; and
    an IGBT.

8. The electronic circuit of claim 7, wherein the MOSFET is a normally-off MOSFET.

9. The electronic circuit of claim 1, wherein the first semiconductor device is a diode.

10. The electronic circuit of claim 1, wherein the first semiconductor device comprises:
    a semiconductor body;
    a drift region of a first conductivity type;
    a junction between the drift region and a further device region;
    a tap region of a second conductivity type complementary to the first conductivity type in the drift region, wherein the tap region is distant to the junction,
    the voltage divider tap is coupled to the tap region, and
    the load path of the first semiconductor device includes the drift region.

11. The electronic circuit of claim 10, wherein the junction is a pn-junction, and the further device region is a semiconductor region of a second conductivity type complementary to the first conductivity type.

12. The electronic circuit of claim 10, wherein the junction is a Schottky junction and the further device region comprises a Schottky metal.

13. The electronic circuit of claim 11, wherein the first semiconductor device is a MOS transistor, the further device region is a body region, and the first semiconductor device further comprises:
    a source region separated from the drift region by the body region;
    a gate electrode adjacent the body region and dielectrically insulated from the body region by a gate dielectric; and
    a drain region separated from the body region by the drift region.

14. The electronic circuit of claim 11, wherein the first semiconductor device is a diode, the further device region is a first emitter region, and the first semiconductor device further comprises:
    a second emitter region separated from the first emitter region by the drift region.

15. The semiconductor device of claim 10,
    wherein the semiconductor body comprises an inner region and an edge region,
    wherein the junction is in the inner region, and
    wherein the tap region is in the edge region.

16. The semiconductor device of claim 10, wherein a distance between the junction and the tap region is longer than 50%, 75% or 90% of a length of the drift region in a current flow direction of the first semiconductor device.

17. The semiconductor device of claim 10, wherein a distance between the junction and the tap region is shorter than 110%, 150% or 200% of a length of the drift region in a current flow direction of the first semiconductor device.

18. The semiconductor device of claim 10, wherein the first semiconductor device comprises a gate terminal, a source terminal, a drain terminal, and wherein the voltage divider tap forms a discrete terminal of the first semiconductor device that is electrically isolated from the gate, source and drain terminals.

19. The semiconductor device of claim 13, wherein the tap region is disposed on the same surface of the semiconductor body as the body region, wherein the drain region is disposed on an opposite surface of the body as the body region, and wherein the drift region electrically separates the tap region from the drain region.

* * * * *